(12) United States Patent
Tsuchiya et al.

(10) Patent No.: US 12,538,636 B2
(45) Date of Patent: Jan. 27, 2026

(54) LIGHT-EMITTING ELEMENT AND DISPLAY DEVICE

(71) Applicant: SHARP KABUSHIKI KAISHA, Sakai (JP)

(72) Inventors: Hiroshi Tsuchiya, Sakai (JP); Masanobu Mizusaki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 674 days.

(21) Appl. No.: 17/911,946

(22) PCT Filed: Mar. 26, 2020

(86) PCT No.: PCT/JP2020/013728
§ 371 (c)(1),
(2) Date: Sep. 15, 2022

(87) PCT Pub. No.: WO2021/192159
PCT Pub. Date: Sep. 30, 2021

(65) Prior Publication Data
US 2023/0143536 A1 May 11, 2023

(51) Int. Cl.
*H10K 50/11* (2023.01)
*H10K 50/125* (2023.01)
(Continued)

(52) U.S. Cl.
CPC .......... *H10K 50/11* (2023.02); *H10K 50/125* (2023.02); *H10K 50/156* (2023.02);
(Continued)

(58) Field of Classification Search
CPC .... H10K 85/342; H10K 85/346; H10K 50/11; H10K 50/15; H10K 50/16; H10K 50/17;
(Continued)

(56) References Cited

U.S. PATENT DOCUMENTS

2008/0074039 A1 3/2008 Seki et al.
2009/0033211 A1 2/2009 Tanabe et al.
(Continued)

FOREIGN PATENT DOCUMENTS

JP 2006-066820 A 3/2006
JP 2007-096023 A 4/2007
(Continued)

*Primary Examiner* — Moin M Rahman
(74) *Attorney, Agent, or Firm* — ScienBiziP, P.C.

(57) ABSTRACT

A light-emitting element includes an anode electrode and a cathode electrode, and is provided with a first hole transport layer, a second hole transport layer, a light-emitting layer, a first electron transport layer, and a second electron transport layer. At a HOMO level, an energy level difference between the second hole transport layer and the light-emitting layer on the second hole transport layer side is from 0.0 eV to 0.15 eV, and at a LUMO level, an energy level difference between the first electron transport layer and the light-emitting layer on the first electron transport layer side is from 0.0 eV to 0.15 eV. The second electron transport layer is a mixed layer that includes an organic material having electron transport properties and an electron-accepting material and contains the electron-accepting material in an amount greater than 50 mass %.

12 Claims, 8 Drawing Sheets

(51) Int. Cl.
*H10K 50/15* (2023.01)
*H10K 50/16* (2023.01)
*H10K 50/852* (2023.01)
*H10K 85/60* (2023.01)
*H10K 59/80* (2023.01)
*H10K 101/30* (2023.01)
*H10K 101/40* (2023.01)
*H10K 102/00* (2023.01)

(52) U.S. Cl.
CPC ......... *H10K 50/166* (2023.02); *H10K 50/852* (2023.02); *H10K 85/611* (2023.02); *H10K 59/876* (2023.02); *H10K 2101/30* (2023.02); *H10K 2101/40* (2023.02); *H10K 2102/351* (2023.02)

(58) Field of Classification Search
CPC .... H10K 50/171; H10K 50/18; H10K 85/322; H10K 85/633; H10K 85/636; H10K 85/6572; H10K 50/12; H10K 50/115; H10K 50/155; H10K 50/165; H10K 50/805; H10K 59/12; H10K 59/38; H10K 85/321; H10K 85/631; H10K 85/654; H10K 85/6574; H10K 50/00–88; H10K 59/00–95; H10K 65/00; H10K 71/00–861; H10K 85/00–791; H10K 2101/00–90; H10K 2102/00–361; H10K 50/10–19; H10K 2101/30; H10K 2102/10; H10K 2102/101; H10K 2102/102; H10K 2102/103; H10K 2102/20; H10K 2102/301; H10K 2102/302; H10K 2102/3023; H10K 2102/3026; H10K 2102/3031; H10K 2102/3035; H10K 2102/311; H10K 2102/321; H10K 2102/331; H10K 2102/341; H10K 59/35; H10K 50/156; H10K 85/615; H10K 85/624; H10K 85/626; H10K 2101/40; H10K 50/852; H10K 50/13; H10K 50/80; C09K 11/06; C09K 2211/185; C09K 11/77; C09K 11/025; B32B 2457/206

See application file for complete search history.

(56) References Cited

U.S. PATENT DOCUMENTS

| | | |
|---|---|---|
| 2012/0248968 A1 | 10/2012 | Ogiwara et al. |
| 2013/0153881 A1* | 6/2013 | Tokoo ............... H10K 50/13 257/40 |
| 2014/0103329 A1 | 4/2014 | Ogiwara et al. |
| 2017/0149007 A1 | 5/2017 | Ogiwara et al. |
| 2020/0411769 A1* | 12/2020 | Gao ..................... C07F 5/027 |
| 2021/0074941 A1 | 3/2021 | Ogiwara et al. |

FOREIGN PATENT DOCUMENTS

| | | |
|---|---|---|
| JP | 2007-266160 A | 10/2007 |
| JP | 2008-084654 A | 4/2008 |
| JP | 2013-191649 A | 9/2013 |
| WO | 2012/039213 A1 | 3/2012 |
| WO | 2012/133188 A1 | 10/2012 |

* cited by examiner

LIGHT-EMITTING ELEMENT AND DISPLAY DEVICE

TECHNICAL FIELD

The disclosure relates to a light-emitting element and a display device including the light-emitting element.

BACKGROUND ART

PTL 1 discloses a method for achieving high efficiency light emission of a light-emitting layer and suppression of deterioration of the light-emitting layer by adding dopants to each organic layer in an organic light-emitting device provided with a plurality of organic layers between electrodes.

CITATION LIST

Patent Literature

PTL 1: WO 2012/039213 A1

SUMMARY

Technical Problem

Even in the light-emitting device (light-emitting element) disclosed in PTL 1, a decrease in luminous efficiency and a shortening of the lifetime of the light-emitting device (light-emitting element) occur due to an accumulation in each organic layer of carriers injected from each electrode into each organic layer between the electrodes, or in other words, due to a bias of the carrier balance in the light-emitting layer.

Solution to Problem

In order to solve the problem described above, a light-emitting element according to the disclosure is provided with an anode electrode and a cathode electrode, and further includes, between the anode electrode and the cathode electrode in order from the anode electrode side, a first hole transport layer, a second hole transport layer, a light-emitting layer, a first electron transport layer, and a second electron transport layer, wherein at a HOMO level, an energy level difference between the second hole transport layer and the light-emitting layer on the second hole transport layer side is from 0.0 eV to 0.15 eV, at a LUMO level, an energy level difference between the first electron transport layer and the light-emitting layer on the first electron transport layer side is from 0.0 eV to 0.15 eV, and the second electron transport layer is a mixed layer including an organic material having electron transport properties and an electron-accepting material, and containing the electron-accepting material in an amount greater than 50 mass %.

Advantageous Effects of Disclosure

According to the configuration described above, a light-emitting element with an extended lifetime and a display device provided with the light-emitting element can be provided in which the carrier injected from each electrode is transported to the light-emitting layer more efficiently, and the luminous efficiency is improved.

DESCRIPTION OF EMBODIMENTS

First Embodiment

Figure 1:
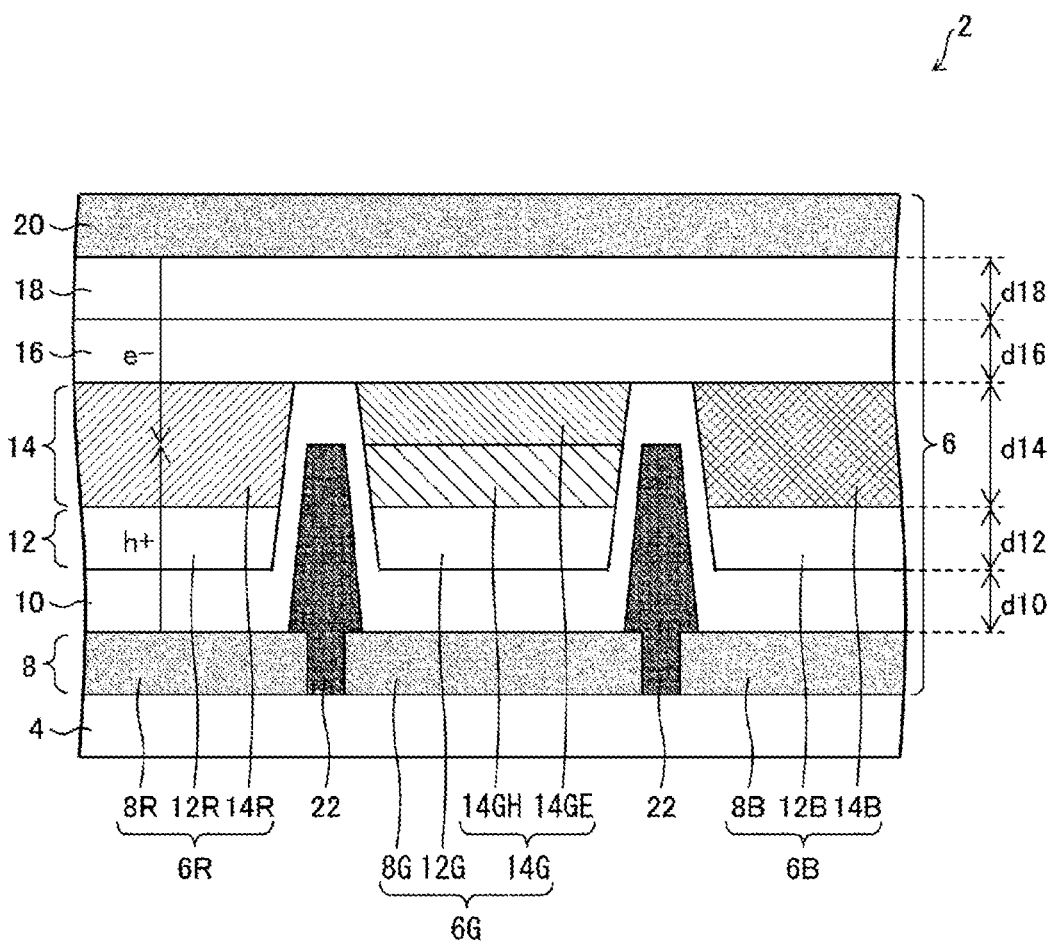
FIG. 1 is a schematic cross-sectional view of a display device according to a first embodiment of the disclosure.
Figure 2:
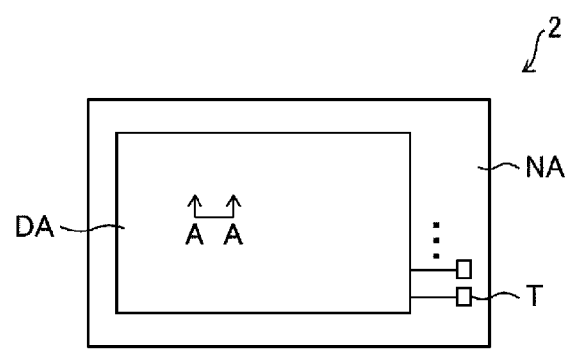
FIG. 2 is a schematic top view of the display device according to the first embodiment of the disclosure.

FIG. 2 is a schematic top view of a display device 2 according to the present embodiment. FIG. 1 is a cross-sectional view taken along a line A-A in FIG. 2.

As illustrated in FIG. 2, the display device 2 according to the present embodiment includes a light-emitting region DA from which light emission is extracted and a frame region NA surrounding a periphery of the light-emitting region DA. A terminal T into which is input a signal for driving each light-emitting element of the display device 2 described in detail below is formed in the frame region NA.

At a position overlapping with the light-emitting region DA in a plan view, as illustrated in FIG. 1, the display device 2 according to the present embodiment includes an array substrate 4 and a light-emitting element layer 6 on the array substrate 4. In particular, the display device 2 has a structure in which respective layers of the light-emitting element layer 6 are laminated on the array substrate 4, in which a Thin Film Transistor (TFT; not illustrated) is formed. Note that, in the present specification, a direction from the light-emitting element layer 6 to the array substrate 4 of the display device 2 is referred to as a "downward direction", and a direction from the light-emitting element layer 6 of the display device 2 to the display surface of the display device 2 is referred to as an "upward direction".

The light-emitting element layer 6 includes, on an anode electrode 8, a first hole transport layer 10, a second hole transport layer 12, a light-emitting layer 14, a first electron transport layer 16, a second electron transport layer 18, and a cathode electrode 20, sequentially laminated from the lower layer. The anode electrode 8 of the light-emitting element layer 6 formed in an upper layer on the array substrate 4 is electrically connected with TFTs of the array substrate 4. Note that, in the display device 2, a sealing layer (not illustrated) is provided to seal the light-emitting element layer 6.

In the present embodiment, the light-emitting element layer 6 includes a light-emitting element 6R, a light-emitting element 6G, and a light-emitting element 6B. The light-emitting element 6R, the light-emitting element 6G, and the light-emitting element 6B may be organic EL elements, that is, OLED elements, in which the light-emitting layer 14 includes an organic fluorescent material or an organic phosphorescent material. In addition to this, the light-emitting element 6R, the light-emitting element 6G, and the light-emitting element 6B may be QLED elements in which the light-emitting layer 14 includes a semiconductor nanoparticle material, that is, a quantum dot material. However, in the present embodiment, various light-emitting elements, without being limited to the OLED elements or the QLED elements, can be used for the light-emitting element 6R, the light-emitting element 6G, and the light-emitting element 6B. The display device 2 has, for example, a plurality of sub-pixels, and each sub-pixel is provided with one light-emitting element 6R, one light-emitting element 6G, and one light-emitting element 6B described above.

Here, each of the anode electrode 8, the second hole transport layer 12, and light-emitting layer 14 is separated by edge covers 22. In particular, in the present embodiment, the anode electrode 8 is separated into an anode electrode 8R for the light-emitting element 6R, an anode electrode 8G for the light-emitting element 6G, and an anode electrode 8B for the light-emitting element 6B by the edge covers 22. The second hole transport layer 12 is separated into a second hole transport layer 12R for the light-emitting element 6R, a second hole transport layer 12G for the light-emitting element 6G, and a second hole transport layer 12B for the light-emitting element 6B by the edge covers 22. Furthermore, the light-emitting layer 14 is separated into a light-emitting layer 14R, a light-emitting layer 14G, and a light-emitting layer 14B by the edge covers 22.

Furthermore, the light-emitting layer 14G includes a first light-emitting layer 14GH and a second light-emitting layer 14GE laminated from the anode electrode 8 side. The first light-emitting layer 14GH is a hole transport type light-emitting layer, and the second light-emitting layer 14GE is an electron transport type light-emitting layer. In other words, the first light-emitting layer 14GH includes a host material having hole transport properties, and the second light-emitting layer 14GE includes a host material having electron transport properties.

Thus, in the present embodiment, the light-emitting layer 14G includes at least two or more types of host materials. In particular, in the present embodiment, the light-emitting layer 14G is provided with only one type of host material in the first light-emitting layer 14GH and only one type of host material in the second light-emitting layer 14GE, the host materials thereof being mutually different, and therefore the light-emitting layer 14G includes only two types of host materials.

Note that the first hole transport layer 10, the first electron transport layer 16, the second electron transport layer 18, and the cathode electrode 20 are not separated by the edge covers 22, and are formed in common.

As illustrated in FIG. 1, the edge covers 22 may be formed at positions covering the side surfaces and a vicinity of peripheral end portions of the upper faces of the anode electrode 8.

In the present embodiment, the light-emitting element 6R includes the anode electrode 8R, the first hole transport layer 10, the second hole transport layer 12R, the light-emitting layer 14R, the first electron transport layer 16, the second electron transport layer 18, and the cathode electrode 20. The light-emitting element 6G includes the anode electrode 8G, the first hole transport layer 10, the second hole transport layer 12G, the light-emitting layer 14G, the first electron transport layer 16, the second electron transport layer 18, and the cathode electrode 20. Furthermore, the light-emitting element 6B includes the anode electrode 8B, the first hole transport layer 10, the second hole transport layer 12B, the light-emitting layer 14B, the first electron transport layer 16, the second electron transport layer 18, and the cathode electrode 20.

In the present embodiment, the light-emitting layer 14R, the light-emitting layer 14G, and the light-emitting layer 14B emit red light, green light, and blue light, respectively. In other words, the light-emitting element 6R, the light-emitting element 6G, and the light-emitting element 6B are light-emitting elements that emit the red light, the green light, and the blue light, respectively.

Here, the blue light refers to, for example, light having a light emission central wavelength in a wavelength band of equal to or greater than 400 nm and equal to or less than 500 nm. The green light refers to, for example, light having a light emission central wavelength in a wavelength band of greater than 500 nm and equal to or less than 600 nm. The red light refers to, for example, light having a light emission central wavelength in a wavelength band of greater than 600 nm and equal to or less than 780 nm.

In the present embodiment, the light-emitting layer 14R and the light-emitting layer 14B are in contact with the second hole transport layer 12 on the anode electrode 8 side and the first electron transport layer 16 on the cathode electrode 20 side. In other words, the single layer light-emitting layer 14R and the light-emitting layer 14B are in contact with both the second hole transport layer 12 and the first electron transport layer On the other hand, the first light-emitting layer 14GH is in contact with the second hole transport layer 12 on the anode electrode 8 side, and is in contact with the second light-emitting layer 14GE on the cathode electrode 20 side. The second light-emitting layer 14GE is in contact with the first light-emitting layer 14GH on the anode electrode 8 side and is in contact with the first electron transport layer 16 on the cathode electrode 20 side.

Note that the display device 2 according to the present embodiment is not limited to the configuration described above, and may include another layer between the second hole transport layer 12 and the light-emitting layer 14 or between the light-emitting layer 14 and the first electron transport layer 16.

The anode electrode 8 and the cathode electrode 20 include conductive materials and are electrically connected to the first hole transport layer 10 and the second electron transport layer 18, respectively. Of the anode electrode 8 and the cathode electrode 20, the electrode closer to the display surface of the display device 2 is a semitransparent electrode.

The anode electrode 8 has a configuration in which ITO (Indium Tin Oxide) is laminated on, for example, an Ag—Pd—Cu alloy. The anode electrode 8 having the above configuration is a reflective electrode that reflects light emitted from the light-emitting layer 14. Thus, among the light emitted from the light-emitting layer 14, light directed in the downward direction can be reflected by the anode electrode 8.

On the other hand, the cathode electrode 20 is configured by, for example, a semi-transparent Mg—Ag alloy. In other words, the cathode electrode 20 is a transmissive electrode that transmits light emitted from the light-emitting layer 14. Thus, among the light emitted from the light-emitting layer 14, light directed in the upward direction passes through the cathode electrode 20. In this manner, the display device 2 can emit the light emitted from the light-emitting layer 14 in the upward direction.

As described above, in the display device 2, both the light emitted in the upward direction and the light emitted in the downward direction from the light-emitting layer 14 can be directed toward the cathode electrode 20 (upward direction). That is, the display device 2 is configured as a top-emitting type display device.

In the present embodiment, the cathode electrode 20, which is a semitransparent electrode, may partially reflect the light emitted from the light-emitting layer 14. In addition, a cavity of the light emitted from the light-emitting layer 14 is formed between the anode electrode 8, which is a reflective electrode, and the cathode electrode 20, which is a semitransparent electrode. By forming the cavity between the anode electrode 8 and the cathode electrode 20, the chromaticity of the light emitted from the light-emitting layer 14 can be improved.

Note that the configuration of the anode electrode 8 and the cathode electrode 20 described above is an example, and may be another configuration.

The light-emitting layer 14 is a layer that emits light as a result of an occurrence of recombination between the positive holes transported from the anode electrode 8 and the electrons transported from the cathode electrode 20. Note that in the light-emitting element 6G, the positive holes transported to the first light-emitting layer 14GH and the electrons transported to the second light-emitting layer 14GE are transported to the interface between the first light-emitting layer 14GH and the second light-emitting layer 14GE, and recombine in the vicinity of the interface.

The first hole transport layer 10 and the second hole transport layer 12 are layers that transport positive holes from the anode electrode 8 to the light-emitting layer 14. The second hole transport layer 12 has a function of inhibiting the transport of electrons from the cathode electrode 20. The first electron transport layer 16 and the second electron transport layer 18 are layers that transport electrons from the cathode electrode 20 to the light-emitting layer 14. The first electron transport layer 16 has a function of inhibiting the transport of positive holes from the anode electrode 8.

In the present embodiment, the second electron transport layer 18 is a mixed layer including an organic material having electron transport properties and an electron-accepting material. In particular, the second electron transport layer 18 contains the electron-accepting material in an amount greater than 50 mass %.

The electron-accepting material included in the second electron transport layer 18 has a function of temporarily capturing the electrons transported by the electron-transporting organic material of the second electron transport layer 18 while the electrons are transported to the first electron transport layer 16. Thus, the electron-accepting material included in the second electron transport layer 18 causes the transport of electrons to the first electron transport layer 16, and by extension the transport of electrons to the light-emitting layer 14, to be more stably implemented. Accordingly, an injection of excess electrons in the light-emitting layer 14 is prevented, and electron excess in the light-emitting layer 14 can be prevented.

When the vacuum level is referenced, the electron-transporting organic material included in the second electron transport layer 18 has, for example, a HOMO level from −6.60 eV to −6.00 eV and a LUMO level from −2.95 eV to −2.45 eV. In the present embodiment, the electron-transporting organic material included in the second electron transport layer 18 has, for example, an oxadiazole structure or a triazole structure. Specifically, for example, the electron-transporting organic material included in the second electron transport layer 18 is an oxadiazole derivative (OXD-7) represented by the following formula.

[Chem. 1]

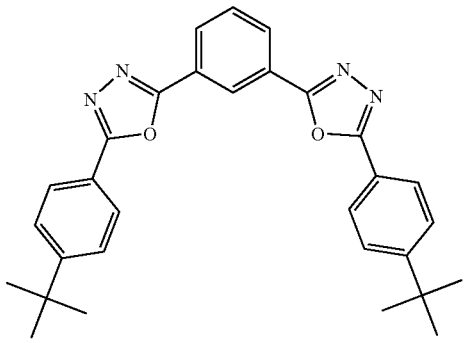

In addition, the electron-transporting organic material included in the second electron transport layer 18 may be a starburst OXD, an oxadiazole derivative (Bu—PBD), a triazole derivative, or bathocuproine, which are represented by the following formulas, respectively.

[Chem. 2]

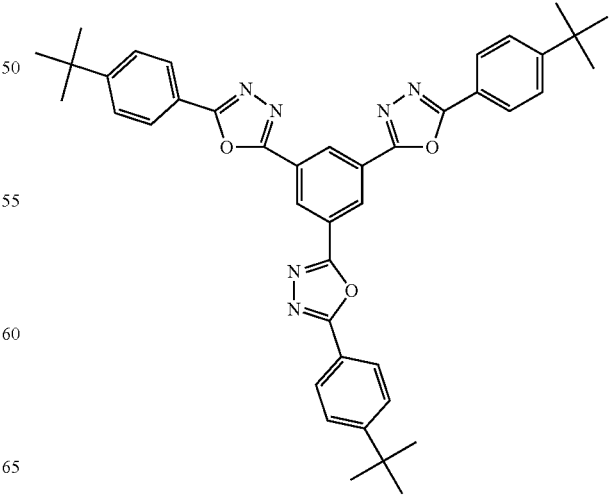

[Chem. 3]

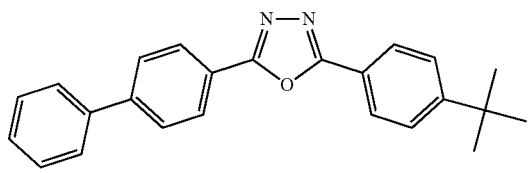

[Chem. 4]

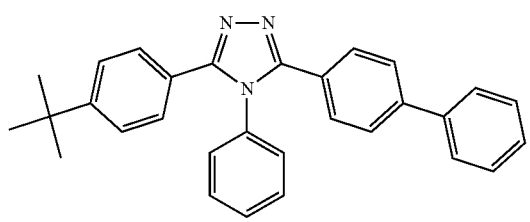

[Chem. 5]

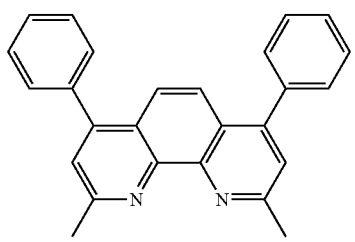

When the vacuum level is referenced, the electron-accepting material included in the second electron transport layer 18 has, for example, a HOMO level from −5.890 eV to −5.70 eV and a LUMO level from −3.55 eV to −3.35 eV. In the present embodiment, the electron-accepting material included in the second electron transport layer 18 is, for example, a lithium complex or a lithium compound. Specifically, for example, the electron-accepting material included in the second electron transport layer 18 is a lithium quinolate complex (Liq) represented by the following formula.

[Chem. 6]

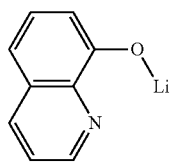

The second electron transport layer 18 includes the lithium quinolate complex as an electron-accepting material, and thereby electrons of the second electron transport layer 18 are more stably transported to the first electron transport layer 16.

In addition, the electron-accepting material included in the second electron transport layer 18 may be trifluoromethanesulfonyl (Li-TFSI), lithium acetoacetate, lithium bis(trimethylsilyl) amide, lithium butoxide, or, alternatively, lithium 1,1,2,2,3,3-hexafluoropropane-1,3-disulfonimide, represented by the following formulas, respectively.

[Chem. 7]

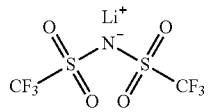

[Chem. 8]

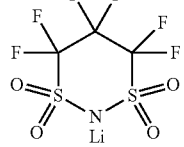

[Chem. 9]

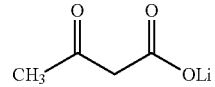

[Chem. 10]

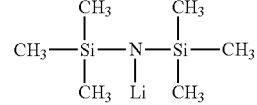

[Chem. 11]

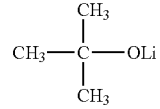

The first hole transport layer 10, the second hole transport layer 12, the light-emitting layer 14, the first electron transport layer 16, and the second electron transport layer 18 may be formed by a known technique, and may be formed by, for example, vapor deposition using a vapor deposition mask. In particular, the second electron transport layer 18 may be formed by co-evaporation of an organic material having electron transport properties and an electron-accepting material.

Note that the display device 2 according to the present embodiment may include, between the anode electrode 8 and the first hole transport layer 10, a hole injection layer (not illustrated) containing a hole injection material. Similarly, the display device 2 according to the present embodiment may include, between the cathode electrode 20 and the second electron transport layer 18, an electron injection layer (not illustrated) containing an electron injection material.

Each organic layer of each of the light-emitting elements 6B, 6G, and 6R according to the present embodiment has a layer thickness as illustrated in FIG. 1. In particular, as illustrated in FIG. 1, the first hole transport layer 10, the second hole transport layer 12, the light-emitting layer 14, the first electron transport layer 16, and the second electron transport layer 18 have layer thicknesses of d10, d12, d14, d16, and d18, respectively.

Here, in the present specification, the layer thickness of a certain layer may be an average value of the layer thickness of the layer, or may be an average value of the layer thickness of the layer at a position at which the layer is formed substantially horizontal to the array substrate 4. In the light-emitting element 6G, the layer thickness d14 is the total layer thickness of the first light-emitting layer 14GH and the second light-emitting layer 14GE. Furthermore, the layer thickness d10, the layer thickness d12, and the layer thickness d14 may be substantially the same or mutually different between the light-emitting element 6B, the light-emitting element 6G, and the light-emitting element 6R.

In each of the light-emitting elements 6B, 6G, and 6R according to the present embodiment, the layer thickness d14 is greater than both the layer thickness d12 and the layer thickness d16. In other words, in each of the light-emitting elements 6B, 6G, and 6R, the layer thickness of the light-emitting layer 14 is greater than the layer thickness of the second hole transport layer 12, and is greater than the layer thickness of the first electron transport layer 16.

According to the configuration described above, in each of the light-emitting elements 6B, 6G, and 6R, the layer thickness of the transport layer of carriers, the layer thereof being adjacent to the light-emitting layer 14, is thinner than the layer thickness of the light-emitting layer 14. As a result, in each of the light-emitting elements 6B, 6G, and 6R, the carriers are more efficiently transported in the carrier transport layer adjacent to the light-emitting layer 14, and the carriers are more easily injected by the light-emitting layer 14.

Additionally, in the light-emitting element 6B, a value obtained by dividing the layer thickness d12 by the layer thickness d14 is greater than 0 and equal to or less than 0.25, and a value obtained by dividing the layer thickness d16 by the layer thickness d12 is greater than 0 and equal to or less than 0.5. In other words, in the light-emitting element 6B, the layer thickness of the second hole transport layer 12B is equal to or less than ¼ the layer thickness of the light-emitting layer 14B, and the layer thickness of the first electron transport layer 16 is equal to or less than one-half the layer thickness of the second hole transport layer 12B. However, the layer thickness of the second hole transport layer 12B and the layer thickness of the first electron transport layer 16 are not 0.

On the other hand, in the light-emitting element 6G, a value obtained by dividing the layer thickness d12 by the layer thickness d14 is greater than 0 and equal to or less than 0.75, and a value obtained by dividing the layer thickness d16 by the layer thickness d12 is greater than 0 and equal to or less than 0.5. In other words, in the light-emitting element 6G, the layer thickness of the second hole transport layer 12G is equal to or less than ¾ the layer thickness of the light-emitting layer 14G, and the layer thickness of the first electron transport layer 16 is equal to or less than one-half the layer thickness of the second hole transport layer 12G. However, the layer thickness of the second hole transport layer 12G and the layer thickness of the first electron transport layer 16 are not 0.

According to the configuration described above, in the light-emitting element 6B and the light-emitting element 6G, the layer thickness of the second hole transport layer 12 is thinner than the layer thickness of the light-emitting layer 14, and the layer thickness of the first electron transport layer 16 is even thinner. As a result, in the light-emitting element 6B and the light-emitting element 6G, carriers are more efficiently transported in the carrier transport layer adjacent to the light-emitting layer 14, and the carriers are more easily injected by the light-emitting layer 14.

Furthermore, in each of the light-emitting elements 6B, 6G, and 6R, a value obtained by dividing the layer thickness d16 by the total layer thickness of the layer thickness d16 and the layer thickness d18 is greater than 0 and less than 0.5. In other words, the layer thickness of the first electron transport layer 16 is less than half of the total layer thickness of the first electron transport layer 16 and the second electron transport layer 18. However, the layer thickness of the first electron transport layer 16 is not 0.

Ordinarily, when the total layer thickness of the first electron transport layer 16 and the second electron transport layer 18 is constant, as the film thickness of the first electron transport layer 16 becomes thinner, the amount of electrons injected into the light-emitting layer 14 is reduced. According to the configuration described above, excessive injection of electrons into the light-emitting layer 14 is efficiently reduced, and the lifetime of the light-emitting layer 14 is improved.

Figure 3:
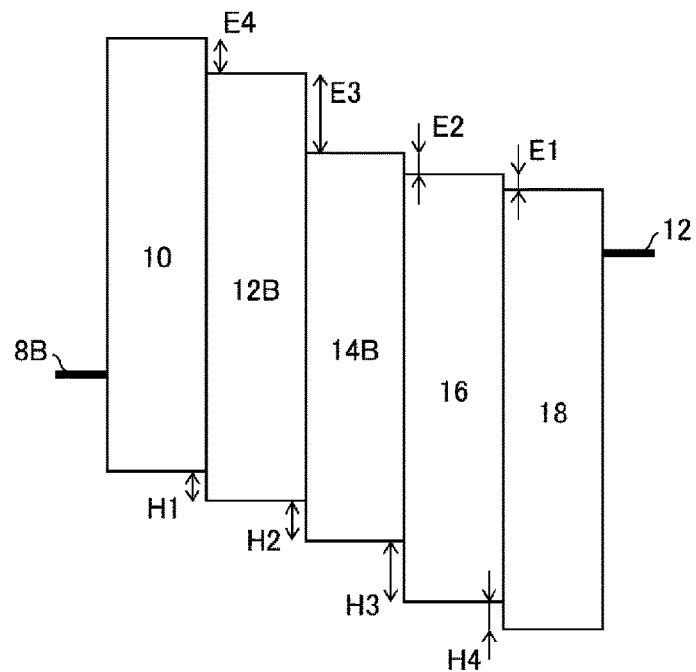
FIG. 3 is an energy diagram illustrating an example of the Fermi level, or the LUMO level and the HOMO level, of each layer in the light-emitting element of the display device according to the first embodiment of the disclosure.
Figure 4:
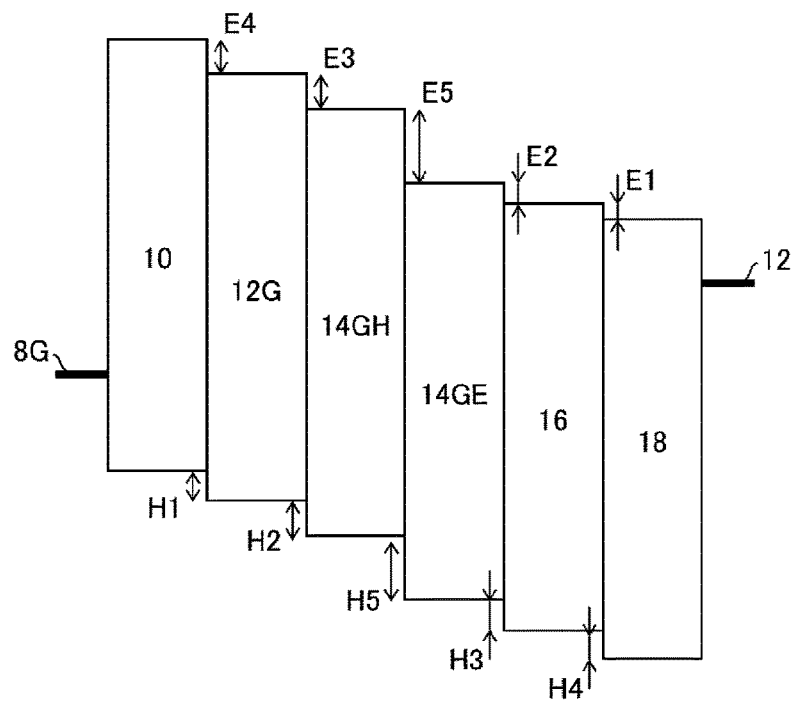
FIG. 4 is an energy diagram illustrating an example of the Fermi level, or the LUMO level and the HOMO level, of each layer in another light-emitting element of the display device according to the first embodiment of the disclosure.

Next, an energy band in each layer of each light-emitting element included in the light-emitting element layer 6 of the display device 2 according to the present embodiment will be described with reference to FIG. 3 and FIG. 4. FIG. 3 is an energy band diagram illustrating an example of the Fermi level or the band gap of each layer of the light-emitting element 6B of the display device 2 according to the present embodiment. FIG. 4 is an energy band diagram illustrating an example of the Fermi level or the band gap of each layer of the light-emitting element 6G of the display device 2 according to the present embodiment.

Note that the energy band diagram of the present specification illustrates the energy level of each layer on the basis of a vacuum level. Further, the energy band diagram of the present specification illustrates a Fermi level or a band gap of a member corresponding to a provided member number. The Fermi levels are indicated for the anode electrode 8 and the cathode electrode 20, and the band gaps from the LUMO level to the HOMO level are indicated for the first hole transport layer 10, the second hole transport layer 12, the light-emitting layer 14, the first electron transport layer 16, and the second electron transport layer 18.

Here, the difference between the HOMO level and the LUMO level between each layer in the light-emitting element layer 6 according to the present embodiment will be described with reference to FIG. 3 and FIG. 4. In the present specification, a value obtained by subtracting the value of the HOMO level of the second layer from the value of the HOMO level of the first layer is referred to as an energy level difference between the HOMO level of the first layer and the HOMO level of the second layer. On the other hand, in the present specification, a value obtained by subtracting the value of the LUMO level of the first layer from the value of the LUMO level of the second layer is referred to as an energy level difference between the LUMO level of the first layer and the LUMO level of the second layer.

In FIG. 3 and FIG. 4, H1 indicates the energy level difference between the HOMO level of the first hole transport layer 10 and the HOMO level of the second hole transport layer 12 in each light-emitting element. H2 indicates the energy level difference between the HOMO level of the second hole transport layer 12 and the HOMO level of the light-emitting layer 14 in each light-emitting element. H3 indicates the energy level difference between the HOMO level of the light-emitting layer 14 and the HOMO level of the first electron transport layer 16 in each light-emitting element. H4 indicates the energy level difference between the HOMO level of the first electron transport layer 16 and the HOMO level of the second electron transport layer 18 in each light-emitting element.

Also, in FIG. 3 and FIG. 4, E1 indicates the energy level difference between the LUMO level of the second electron transport layer 18 and the LUMO level of the first electron transport layer 16 in each light-emitting element. E2 indicates the energy level difference between the LUMO level of the first electron transport layer 16 and the LUMO level of the light-emitting layer 14 in each light-emitting element. E3 indicates the energy level difference between the LUMO level of the light-emitting layer 14 and the LUMO level of the second hole transport layer 12 in each light-emitting element. E4 indicates the energy level difference between the LUMO level of the second hole transport layer 12 and the LUMO level of the first hole transport layer 10 in each light-emitting element.

In particular, the energy level difference H2 in FIG. 4 indicates the energy level difference between the HOMO level of the second hole transport layer 12G and the HOMO level of the first light-emitting layer 14GH in the light-emitting element 6G. The energy level difference E2 in FIG. 4 indicates the energy level difference between the LUMO level of the first electron transport layer 16 and the LUMO level of the second light-emitting layer 14GE in the light-emitting element 6G.

In FIG. 4, H5 indicates the energy level difference between the HOMO level of the first light-emitting layer 14GH and the HOMO level of the second light-emitting layer 14GE in the light-emitting element 6G. E5 indicates the energy level difference between the LUMO level of the second light-emitting layer 14GE and the LUMO level of the first light-emitting layer 14GH in the light-emitting element 6G.

In each of the light-emitting elements 6B and 6G according to the present embodiment, both the energy level difference H2 and the energy level difference E2 are from 0.0 eV to 0.15 eV. In other words, in the light-emitting element 6B, the energy level difference in terms of the HOMO level between the second hole transport layer 12B and the light-emitting layer 14B, and the energy level difference in terms of the LUMO level between the first electron transport layer 16 and the light-emitting layer 14B is from 0.0 eV to 0.15 eV. In addition, in the light-emitting element 6G, the energy level difference in terms of the HOMO level between the second hole transport layer 12G and the first light-emitting layer 14GH, and the energy level difference in terms of the LUMO level between the first electron transport layer 16 and the second light-emitting layer 14GE is from 0.0 eV to 0.15 eV.

According to the configuration described above, in each of the light-emitting elements 6B and 6G, barriers of injection of positive holes from the second hole transport layer 12 into the light-emitting layer 14, and barriers of injection of positive holes from the first electron transport layer 16 into the light-emitting layer 14 are reduced. Thus, the injection efficiency of each carrier into the light-emitting layer 14 is improved in each of the light-emitting elements 6B and 6G.

The value of the HOMO level of the light-emitting layer 14B is greater than the value of the HOMO level of the first electron transport layer 16 by 0.25 eV or more, and more preferably by 0.45 eV or more. Furthermore, the value of the LUMO level of the second hole transport layer 12B is greater than the value of the LUMO level of the light-emitting layer 14B by 0.25 eV or more, and more preferably by 0.45 eV or more.

The value of the HOMO level of the second light-emitting layer 14GE is greater than the value of the HOMO level of the first electron transport layer 16 by 0.25 eV or more, and more preferably by 0.45 eV or more. Furthermore, the value of the LUMO level of the second hole transport layer 12G is greater than the value of the LUMO level of the first light-emitting layer 14GH by 0.25 eV or more, and more preferably by 0.45 eV or more.

Also, the value of the HOMO level of each of the light-emitting layer 14B and the second light-emitting layer 14GE is greater than the value of the HOMO level of the first electron transport layer 16 and/or the value of the HOMO level of the second electron transport layer 18 by 0.45 eV or more. Furthermore, the value of the LUMO level of the first hole transport layer 10 and/or the value of the LUMO level of the second hole transport layer 12B and the second hole transport layer 12G is greater than the value of the LUMO level of each of the light-emitting layer 14B and the first light-emitting layer 14GH by 0.45 eV or more.

Furthermore, the value of the HOMO level of the first light-emitting layer 14GH is greater than the value of the HOMO level of the second light-emitting layer 14GE by 0.25 eV or more. Furthermore, the value of the LUMO level of the first light-emitting layer 14GH is greater than the value of the LUMO level of the second light-emitting layer 14GE by 0.25 eV or more.

According to these configurations, in each of the light-emitting element 6B and the light-emitting element 6G, the outward flow of positive holes injected into the light-emitting layer 14 towards the first electron transport layer 16 side, and the outward flow of electrons injected into the light-emitting layer 14 towards the second hole transport layer 12 side are more effectively reduced. Through this, the electron concentration and the positive hole concentration in the light-emitting layer 14 of each of the light-emitting element 6B and the light-emitting element 6G are improved, and the efficiency of recombination of the carriers is enhanced. Furthermore, in each of the light-emitting element 6B and the light-emitting element 6G, damage to each organic layer in association with the outward flow of carriers injected into the light-emitting layer 14 is reduced, and thus the lifetime of each of the light-emitting element 6B and the light-emitting element 6G is improved.

In the light-emitting element 6B, the recombination of positive holes and electrons occurs in the light-emitting layer 14B. Thus, light having energy corresponding to the difference between the value of the LUMO level of the light-emitting layer 14B and the value of the HOMO level of the light-emitting layer 14B originates from the light-emitting layer 14B. The difference between the value of a LUMO level of the light-emitting layer 14B and the value of a HOMO level of the light-emitting layer 14B is preferably greater than 2.7 eV and equal to or less than 3.1 eV.

In the light-emitting element 6G, the recombination of positive holes and electrons occurs at an interface between the first light-emitting layer 14GH and the second light-emitting layer 14GE. Thus, light having energy corresponding to the difference between the value of the LUMO level of the second light-emitting layer 14GE and the value of the HOMO level of the first light-emitting layer 14GH is generated from the light-emitting layer 14G. The difference between the value of the LUMO level of the second light-emitting layer 14GE and the value of the HOMO level of the first light-emitting layer 14GH is preferably from 2.4 eV to 2.7 eV.

Note that the light-emitting element 6R according to the present embodiment has the same configuration as the light-emitting element 6B with the exception that the light from the light-emitting layer 14R is red light. For example, the relationship between the value of the LUMO level and the value of the HOMO level of each layer of the light-emitting element 6R and the relationship between the layer thicknesses thereof are the same as the relationship between the value of the LUMO level and the value of the HOMO level of each layer of the light-emitting element 6B and the relationship between the layer thicknesses thereof.

As described above, in each of the light-emitting elements 6B, 6G, and 6R according to the present embodiment, both the energy level difference H2 and the energy level difference E2 are from 0.0 eV to 0.15 eV. According to the configuration described above, the injection efficiency of each carrier into the light-emitting layer 14 is improved in each of the light-emitting element 6B, the light-emitting element 6G, and the light-emitting element 6R.

In addition, in each of the light-emitting elements 6B, 6G, and 6R according to the present embodiment, the second electron transport layer 18 is a mixed layer that includes an organic material having electron transporting properties and an electron-accepting material, and contains the electron-accepting material in an amount greater than 50 mass %.

According to the configuration described above, electrons are more stably transported to the first electron transport layer 16 in each of the light-emitting elements 6B, 6G, and 6R. Accordingly, the light-emitting elements 6B, 6G, and 6R can prevent excessive injection of electrons in the light-emitting layer 14, and can prevent electron excess in the light-emitting layer 14.

Through the elimination of electron excess in the light-emitting layer 14, recombination of positive holes and electrons in the light-emitting layer 14 occurs more efficiently. Thus, the luminous efficiency of the light-emitting element 6B, the light-emitting element 6G, and the light-emitting element 6R is improved.

In addition, since electron excess in the light-emitting layer 14 is eliminated, recombination of charges that do not contribute to light emission, including a deactivation process such as an Auger process, in the light-emitting layer 14 is unlikely to occur. The outward flow of electrons from the light-emitting layer 14 to each layer of the second hole transport layer 12 side is prevented, and therefore the recombination of charges that do not contribute to light emission is less likely to occur even in each layer further to the second hole transport layer 12 side than the light-emitting layer 14. Through this, damage to the light-emitting layer 14 and to each layer further to the second hole transport layer 12 side than the light-emitting layer 14 is prevented, and the lifetime of the light-emitting element 6B, the light-emitting element 6G, and the light-emitting element 6R is improved.

Accordingly, the light-emitting element 6B, the light-emitting element 6G, and the light-emitting element 6R according to the present embodiment can eliminate electron excess in the light-emitting layer 14 while improving the transport efficiency of each carrier to the light-emitting layer 14. Therefore, the luminous efficiency and the lifetime of the light-emitting element 6B, the light-emitting element 6G, and the light-emitting element 6R according to the present embodiment are more efficiently improved.

Light-emitting elements according to each of Examples 1 to 4 below were prepared with each light-emitting element having the same configuration as each light-emitting element of the display device 2 according to the present embodiment, and the physical properties were measured.

Example 1

A light-emitting element according to Example 1 was prepared with the same structure as the light-emitting element 6B of the display device 2 according to the present embodiment.

In the manufacturing of the light-emitting element according to the present example, ITO was first formed as an anode electrode 8.

Next, a film of a first hole transport layer 10 (HOMO: −5.50 eV, LUMO: −2.42 eV) containing an aromatic amine-based compound was formed as a hole transport material on the anode electrode 8 through low-temperature chemical vapor deposition (CVD) of the hole transport material.

Next, a film of a second hole transport layer 12B (HOMO: −5.60 eV, LUMO: −2.52 eV) containing a carbazole-based compound was formed as an electron blocking material on an upper layer of the first hole transport layer 10 through low-temperature CVD of the electron blocking material.

Next, a light-emitting layer 14B was formed on the upper layer of the second hole transport layer 12B. The light-emitting layer 14B was formed by co-evaporation of an anthracene-adamantane based compound (HOMO: −5.74 eV, LUMO: −2.88 eV) serving as a host material and an anthracene-naphthalene based compound (HOMO: −5.85 eV, LUMO: −2.90 eV) serving as a fluorescence emission dopant.

Next, a first electron transport layer 16 (HOMO: −6.00 eV, LUMO: −2.95 eV) containing a triazole-based compound was formed as a hole blocking material on the upper layer of the light-emitting layer 14B by vapor deposition of the hole blocking material.

Next, a second electron transport layer 18 was formed on the upper layer of the first electron transport layer 16. The second electron transport layer 18 was formed by co-evaporation of an organic material having electron transport properties and an electron-accepting material at a mass ratio of 4:6. An oxadiazole derivative (OXD-7) (HOMO: −6.34 eV, LUMO: −2.92 eV) was used as the organic material having electron transport properties, of the second electron transport layer 18. A lithium quinolate complex (Liq) (HOMO: −5.78 eV, LUMO: −3.46 eV) was used as the electron-accepting material of the second electron transport layer 18.

In the present example, lithium fluoride was further deposited on the upper layer of the second electron transport layer 18 to form an electron injection layer.

An alloy of Mg—Ag was then vapor deposited on the upper layer of the electron injection layer to form a cathode electrode 20.

In the present example, a capping layer made from a compound containing an aromatic amine group was further formed by vapor deposition on the upper layer of the cathode electrode 20, and the light-emitting element was then sealed using a sealing material containing an inorganic-organic composite material.

In the present example, a light-emitting element that emits light of (x, y)=(0.141, 0.045) in CIE chromaticity coordinates was obtained. Note that in the present example, the difference between the value of the LUMO level of the light-emitting layer 14B and the value of the HOMO level of the light-emitting layer 14B was 2.95 eV.

Also note that in Example 1, the layer thickness d10, the layer thickness d12, the layer thickness d14, the layer thickness d16, and the layer thickness d18 were set to 110 nm, 5 nm, 20 nm, 5 nm, and 25 nm, respectively.

Example 2

A light-emitting element according to Example 2 was manufactured by the same technique as the light-emitting element according to Example 1 and had the same structure as the light-emitting element according to Example 1 with the exception of the value of the layer thickness d12. The layer thickness d12 of the light-emitting element according to the Example 2 was set to 10 nm. In the present example, a light-emitting element that emits light of (x, y)=(0.140, 0.047) in CIE chromaticity coordinates was obtained.

Example 3

A light-emitting element according to Example 3 was prepared with the same structure as the light-emitting element 6G of the display device 2 according to the present embodiment.

In the manufacturing of the light-emitting element according to the present example, ITO was first formed as an anode electrode 8.

Next, a film of a first hole transport layer 10 (HOMO: −5.50 eV, LUMO: −2.42 eV) containing an aromatic amine-based compound was formed as a hole transport material on the anode electrode 8 through low-temperature chemical vapor deposition (CVD) of the hole transport material.

Next, a film of a second hole transport layer 12G (HOMO: −5.60 eV, LUMO: −2.47 eV) containing a carbazole-based compound was formed as an electron blocking material on the upper layer of the first hole transport layer 10 through low-temperature CVD of the electron blocking material.

Next, the light-emitting layer 14G was formed by sequentially forming the first light-emitting layer 14GH and the second light-emitting layer 14GE on the upper layer of the second hole transport layer 12G. The light-emitting layer 14G was formed by co-evaporation of three materials including a rubrene-based compound (HOMO: −5.60 eV, LUMO: −2.34 eV) serving as a hole transport material, Alq3 (tris(8-hydroxyquinolinato) aluminum) (HOMO: −5.96 eV, LUMO: −2.84 eV) serving as an electron-transporting material, and an iridium complex (HOMO: −5.60 eV, LUMO: −2.90 eV) serving as a phosphorescence emission dopant.

Next, a first electron transport layer 16 (HOMO: −6.02 eV, LUMO: −2.94 eV) containing a triazole-based compound was formed as a hole blocking material on the upper layer of the light-emitting layer 14G by vapor deposition of the hole blocking material.

Next, a second electron transport layer 18 was formed on the upper layer of the first electron transport layer 16. The second electron transport layer 18 was formed by co-evaporation of an organic material having electron transport properties and an electron-accepting material at a mass ratio of 4:6. An oxadiazole derivative (OXD-7) (HOMO: −6.34 eV, LUMO: −2.92 eV) was used as the organic material having electron transport properties, of the second electron transport layer 18. A lithium quinolate complex (Liq) (HOMO: −5.78 eV, LUMO: −3.46 eV) was used as the electron-accepting material of the second electron transport layer 18.

In the present example, lithium fluoride was further deposited on the upper layer of the second electron transport layer 18 to form an electron injection layer.

Through the same methods as those in the previous example, the cathode electrode 20 and the capping layer were formed on the upper layer of the electron injection layer, and the light-emitting element was sealed by the sealing material.

In the present example, a light-emitting element that emits light of (x, y)=(0.221, 0.720) in CIE chromaticity coordinates was obtained. Note that in the present example, the difference between the value of the LUMO level of the second light-emitting layer 14GE and the value of the HOMO level of the first light-emitting layer 14GH was 2.70 eV.

Also note that in Example 34, the layer thickness d10, the layer thickness d12, the layer thickness d14, the layer thickness d16, and the layer thickness d18 were set to 110 nm, 25 nm, 40 nm, 5 nm, and 25 nm, respectively.

Example 4

A light-emitting element according to Example 4 was manufactured by the same technique as the light-emitting element according to Example 3 and had the same structure as the light-emitting element according to Example 3 with the exception of the value of the layer thickness d12. The layer thickness d12 of the light-emitting element according to the Example 4 was set to 35 nm. In the present example, a light-emitting element that emits light of (x, y)=(0.220, 0.720) in CIE chromaticity coordinates was obtained.

Next, the physical properties of the light-emitting elements according to each of the examples described above were measured, and the physical properties thereof were compared.

First, the values of the HOMO level and the LUMO level of each layer of each light-emitting element were measured, and the HOMO level difference and the LUMO level difference between each layer were measured. Specifically, a Photoemission Yield Spectroscopy (PYS) apparatus (AC-3, available from RIKEN KEIKI Co., Ltd.) was used to determine the value of the HOMO level of each layer of each light-emitting element. Furthermore, the value of the LUMO level was determined by measuring the band gap of each layer of each light-emitting element by the ultraviolet spectrum measurement.

Figure 5:
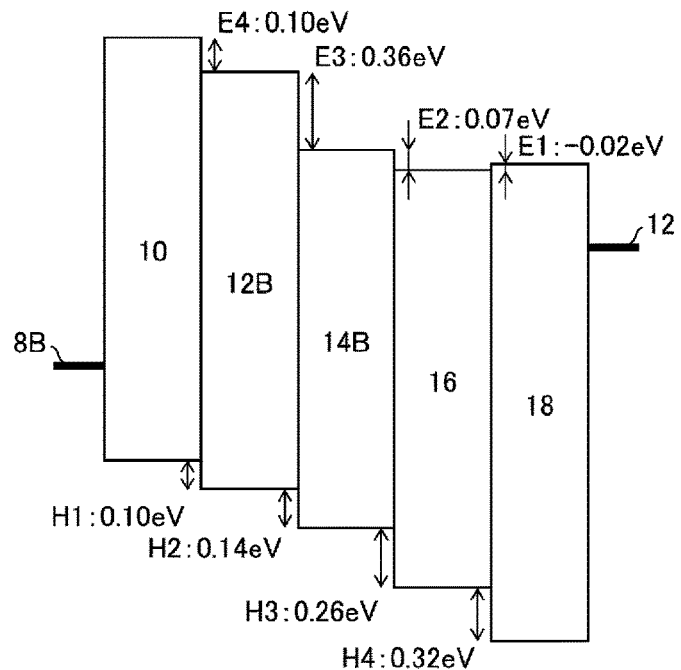
FIG. 5 is an energy diagram illustrating an example of the Fermi level, or the LUMO level and the HOMO level, of each layer in the light-emitting elements according to each of Example 1 and Example 2 or the disclosure.
Figure 6:
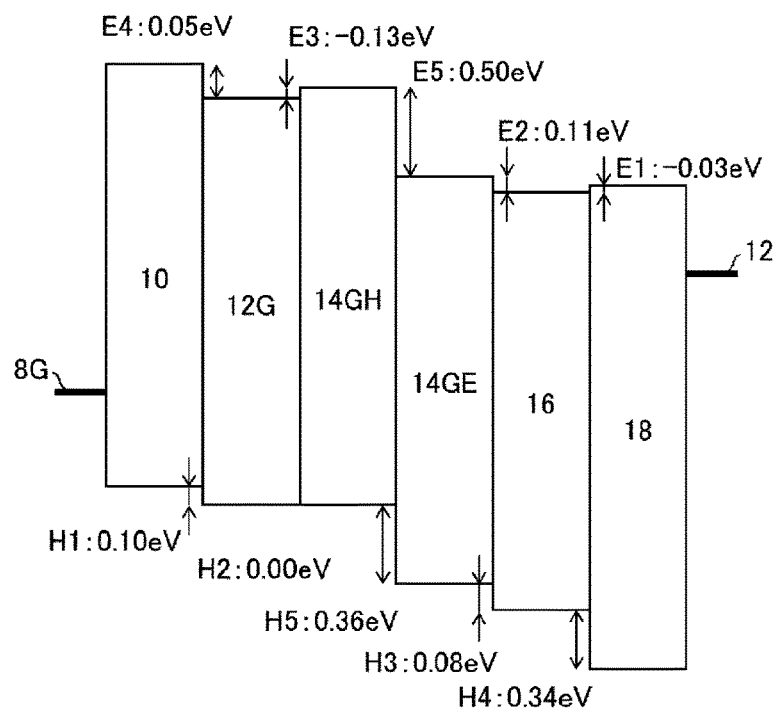
FIG. 6 is an energy diagram illustrating an example of the Fermi level, or the LUMO level and the HOMO level, of each layer in the light-emitting elements according to each of Example 3 and Example 4 of the disclosure.

The energy diagrams of each layer of the light-emitting elements according to each of the examples are illustrated in FIGS. 5 and 6 based on the results of the measurements. FIG. 5 illustrates an energy diagram of each layer of the light-emitting elements according to each of Example 1 and Example 2. FIG. 6 illustrates an energy diagram of each layer of the light-emitting elements according to each of Example 3 and Example 4.

In FIGS. 5 and 6, the numeric values of "H1" to "H5" and "E1" to "E5" indicate energy values of the energy level differences H1 to H5 and the energy level differences E1 to E5, respectively. Note that in FIGS. 5 and 6, the band gap of the second electron transport layer 18 indicates the band gap of the electron-transporting organic material of the second electron transport layer 18. In other words, the energy level difference H4 indicates the difference between the HOMO level of the first electron transport layer 16 and the HOMO level of the electron-transporting organic material of the second electron transport layer 18. Similarly, the energy level difference E1 indicates the difference between the LUMO level of the first electron transport layer 16 and the LUMO level of the electron-transporting organic material of the second electron transport layer 18.

Also, in each example, the negative numeric value of the "E1" section indicates that the value of the LUMO level of the second electron transport layer 18 is smaller than the value of the LUMO level of the first electron transport layer 16. In Example 3 and Example 4, the values of the row of "E3" being negative indicates that the value of the LUMO level of the second hole transport layer 12G is smaller than the value of the LUMO level of the first light-emitting layer 14GH.

Next, under an environmental temperature of 25 degrees Celsius, a voltage generated by a current having a current density of 10 mA/cm$^2$ was applied between electrodes of each of the light-emitting elements, and the external quantum efficiency and the lifetime were measured.

The measured physical properties of the light-emitting elements according to each of the examples and the comparative examples are listed in Table 1 below.

TABLE 1

|  | Example 1 | Example 2 | Example 3 | Example 4 |
|---|---|---|---|---|
| d10 (nm) | 110 | 110 | 110 | 110 |
| d12 (nm) | 5 | 10 | 25 | 35 |
| d14 (nm) | 20 | 20 | 40 | 40 |
| d16 (nm) | 5 | 5 | 5 | 5 |
| d18 (nm) | 25 | 25 | 25 | 25 |
| Voltage (V) | 4.2 | 4.7 | 4.2 | 4.4 |
| EQE (%) | 12.7 | 12 | 32.5 | 29 |
| Lifetime (h) | 2900 | 2100 | 3300 | 1700 |

In Table 1, the columns of "Example 1" to "Example 4" indicate the physical properties of the light-emitting elements according to the respective examples.

In Table 1, the rows of "d10", "d12", "d14", "d16", and "d18" indicate the values of the layer thicknesses d10, d12, d14, d16, and d18, respectively, in units of nm.

In Table 1, the "voltage" row indicates, in units of V, the magnitude of the voltage required to generate a current with a current density of 10 mA/cm$^2$ between the electrodes of each light-emitting element. The "EQE" column indicates the percentage of external quantum efficiency of each light-emitting element under the application of the above voltage. The row of "lifetime" indicates the duration until the luminance of each light-emitting element reaches 90 percent of the initial luminance under the application of the above voltage as units of time (h).

The layer thickness of the second hole transport layer of the light-emitting element according to Example 1 is thinner than that of the light-emitting element according to Example 2. Thus, with the light-emitting element according to Example 1, positive holes are more easily injected into the light-emitting layer 14, and electron excess in the light-emitting layer 14 is eliminated. Accordingly, as shown in Table 1, the light-emitting element according to Example 1 exhibits improved external quantum efficiency and lifetime in comparison to the light-emitting element according to Example 2.

Similarly, the layer thickness of the second hole transport layer of the light-emitting element according to Example 3 is thinner than that of the light-emitting element according to Example 4. Thus, with the light-emitting element according to Example 3, positive holes are more easily injected into the light-emitting layer 14, and electron excess in the light-emitting layer 14 is eliminated. Accordingly, as shown in Table 1, the light-emitting element according to Example 3 exhibits improved external quantum efficiency and lifetime in comparison to the light-emitting element according to Example 4.

Next, the impedance spectrum of the positive holes of the light-emitting element according to each embodiment was measured, and a comparison was implemented. The impedance spectra of the positive holes of the light-emitting elements according to each embodiment are illustrated in FIGS. 7 to 10.

Figure 7:
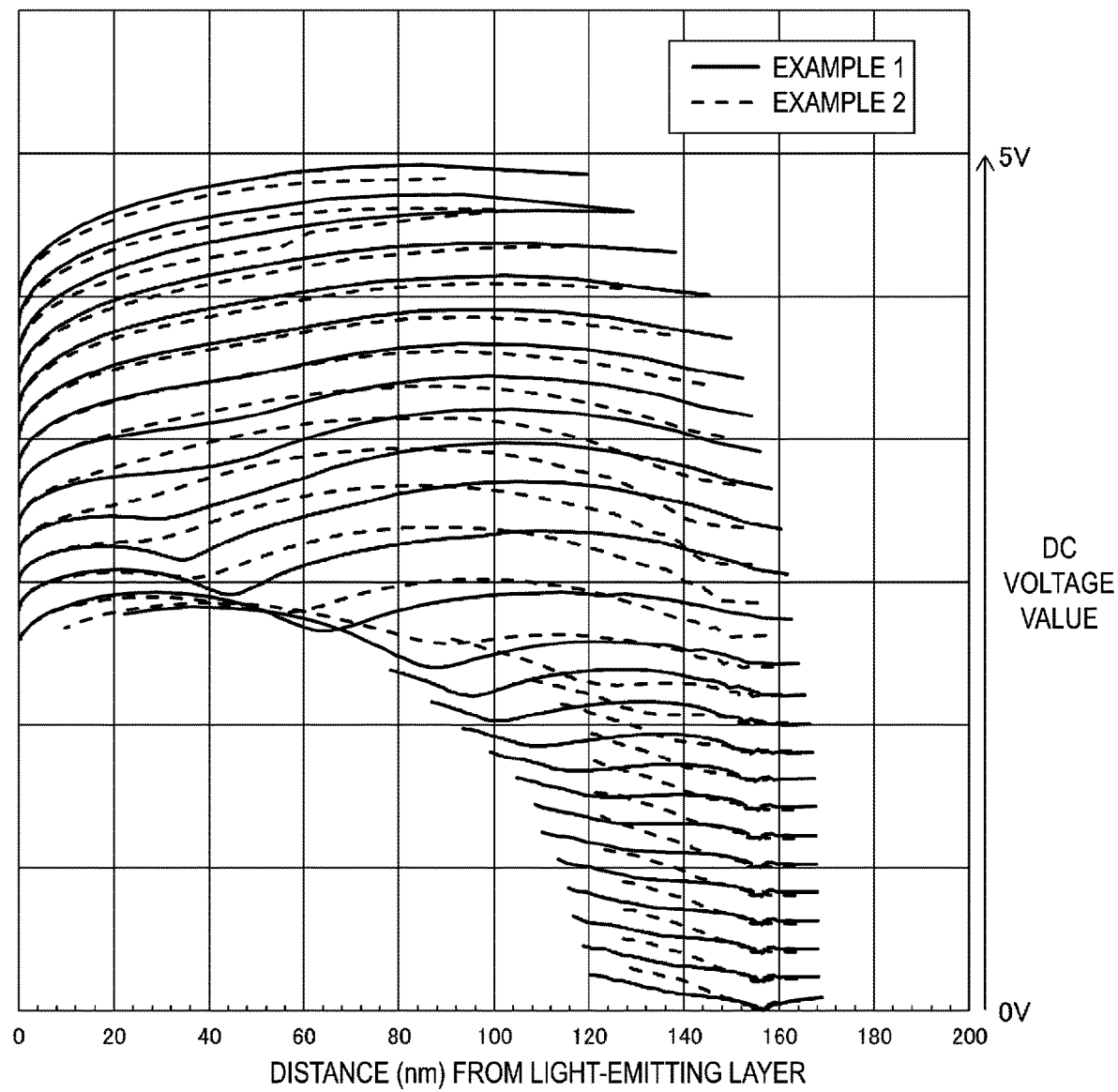
FIG. 7 is a spectrum diagram of a Cole-Cole plot showing the results of impedance measurements carried out on the light-emitting elements according to each of Example 1 and Example 2 of the disclosure.
Figure 8:
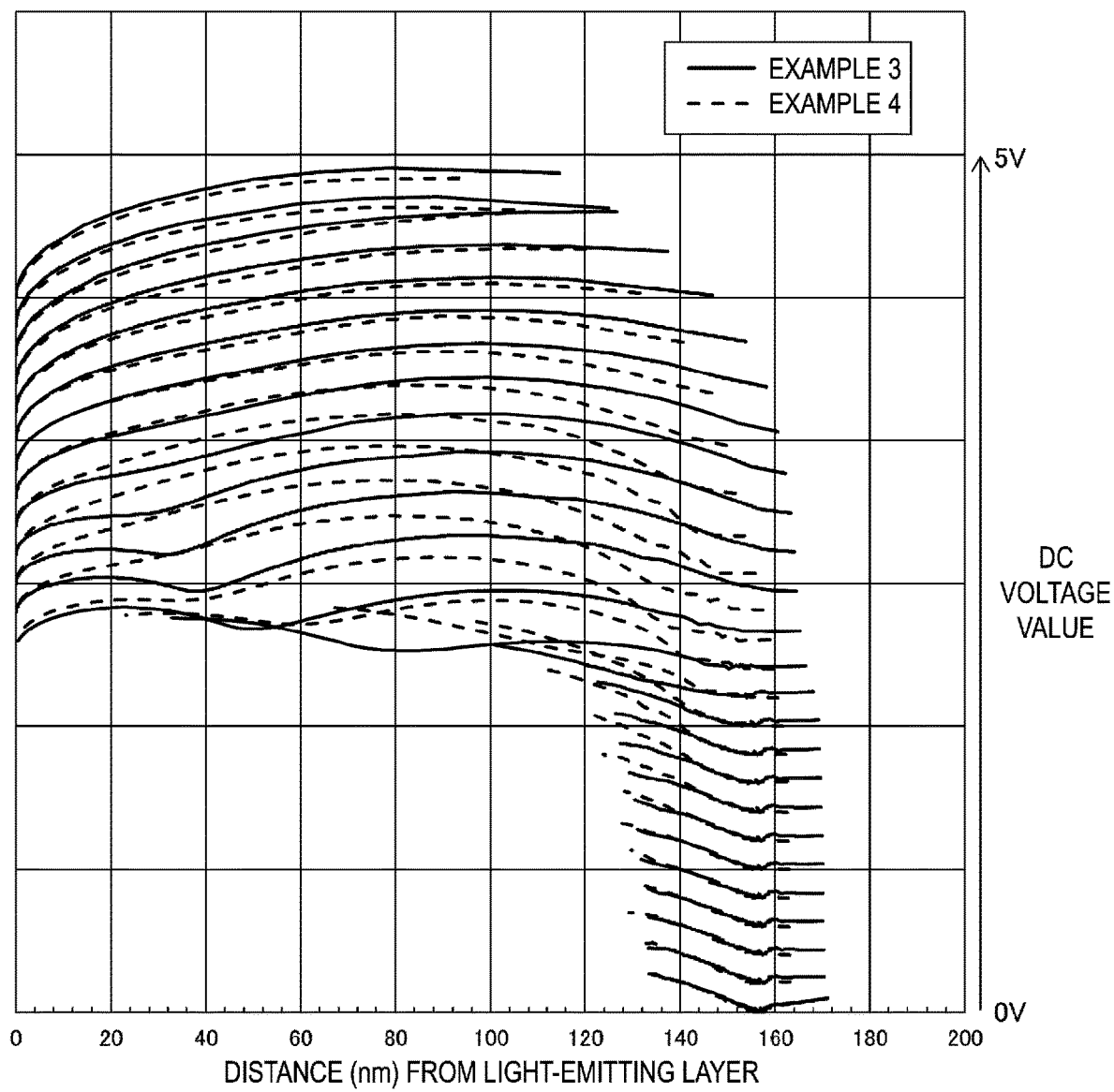
FIG. 8 is a spectrum diagram of a Cole-Cole plot showing the results of impedance measurements carried out on the light-emitting elements according to each of Example 3 and Example 4 of the disclosure.
Figure 9:
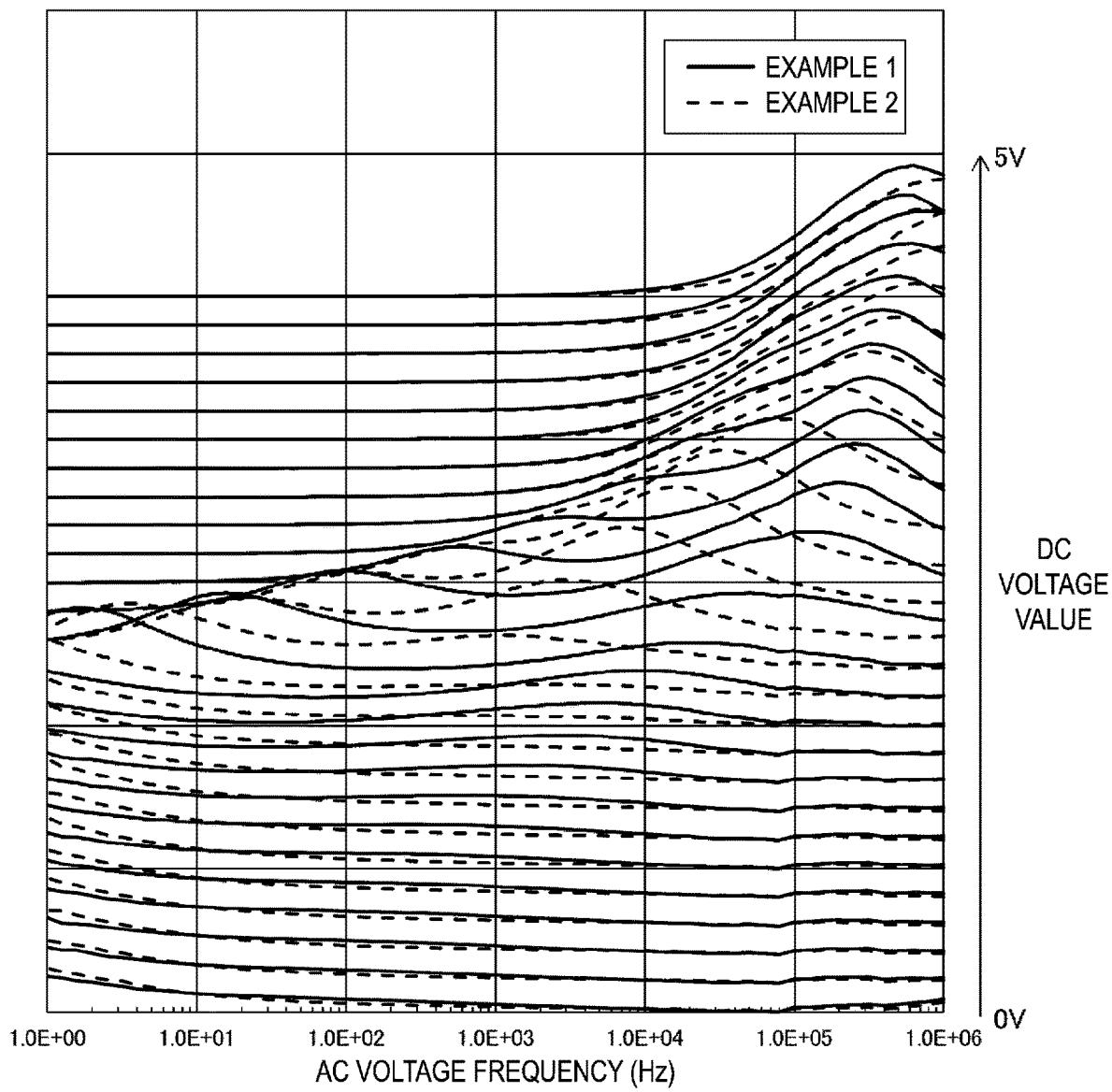
FIG. 9 is a spectral diagram of a Bode plot showing the results of impedance measurements carried out on the light-emitting elements according to each of Example 1 and Example 2 of the disclosure.
Figure 10:
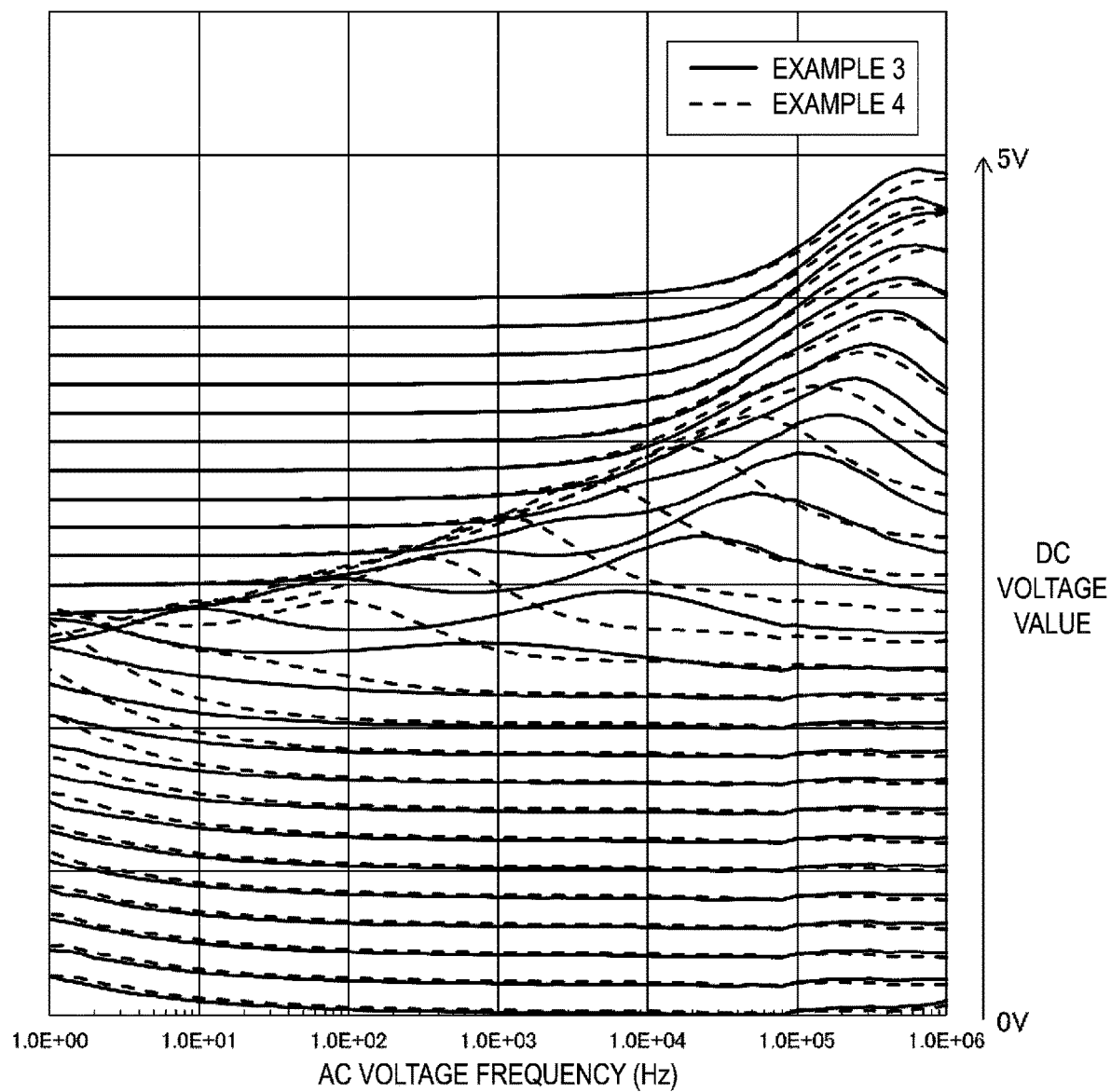
FIG. 10 is a spectral diagram of a Bode plot showing the results of impedance measurements carried out on the light-emitting elements according to each of Example 3 and Example 4 of the disclosure.

In FIG. 7 and FIG. 9, the measurement results for Example 1 are indicated by solid lines, and the measurement results for Example 2 are indicated by dashed lines. In FIG. 8 and FIG. 10, the measurement results for Example 3 are indicated by solid lines, and the measurement results for Example 4 are indicated by dashed lines.

The impedance spectrum of the positive holes of the light-emitting element according to each example was measured by measuring the impedance of the positive holes while applying, to the light-emitting element, a voltage in which the AC voltage of a constant amplitude was superimposed on a constant DC voltage. In the measurement of the impedance spectrum of the light-emitting element according to each example, the impedance spectrum was measured for each example while successively increasing, from 0 V to 5 V, the DC voltage component of the voltage applied to the light-emitting element. In FIG. 7 to FIG. 10, the measurement results are shown shifted in the upward direction of the vertical axis for each DC voltage value applied to the light-emitting element.

FIG. 7 and FIG. 8 each present an impedance spectrum based on a Cole-Cole plot of the light-emitting element according to each example. In FIG. 7 and FIG. 8, the horizontal axis indicates a distance of the light-emitting element according to each example from the light-emitting layer 14 in a direction toward the anode electrode 8. Thus, the left end of each spectrum in FIGS. 7 and 8 indicates to what distance from the light-emitting layer 14 the positive holes were injected from the anode electrode. Here, in FIGS. 7 and 9, a spectrum in which the left end reaches 0 nm on the horizontal axis indicates that the positive holes are injected into the light-emitting layer 14 and are recombined with electrons.

As shown in FIG. 7, the left end of the impedance spectrum of the light-emitting element according to Example 1 reaches 0 nm on the horizontal axis at a lower DC voltage value compared to the impedance spectrum of the light-emitting element according to Example 2. This indicates that with the light-emitting element according to Example 1, the positive holes are efficiently transported at a lower applied voltage compared to the light-emitting element according to Example 2, and recombination of the positive holes and electrons occurs. This is thought to be because the layer thickness d12 of the second hole transport layer 12 of the light-emitting element according to Example 1 is thinner than the layer thickness d12 of the second hole transport layer 12 of the light-emitting element according to Example 2, and thus the positive holes are easily injected into the light-emitting layer. Therefore, in the light-emitting element according to Example 1, a shortage of positive holes in the light-emitting layer 14 is more efficiently eliminated in comparison to the light-emitting element according to Example 2, and the external quantum efficiency and the lifetime are improved.

Similarly, as shown in FIG. 8, the left end of the impedance spectrum of the light-emitting element according to Example 3 reaches 0 nm on the horizontal axis at a lower DC voltage value compared to the impedance spectrum of the light-emitting element according to Example 4. This is considered to occur for the same reason described in the comparison between the light-emitting element according to Example 1 and the light-emitting element according to Example 2. Therefore, in the light-emitting element according to Example 3, a shortage of positive holes in the light-emitting layer 14 is more efficiently eliminated in comparison to the light-emitting element according to Example 4, and the external quantum efficiency and the lifetime are improved.

FIG. 9 and FIG. 10 each present an impedance spectrum based on a Bode plot of the light-emitting element according to each example. The impedance spectrum based on the Bode plot was measured by measuring the impedance of the carriers while changing the frequency of the AC voltage component of the voltage applied to the light-emitting element of each example from 1 Hz to $10^6$ Hz.

In FIG. 9 and FIG. 10, the peak of each spectrum indicates the relaxation frequency of each carrier, or in other words, the frequency at which each carrier resonates at the frequency of the AC voltage component of the applied voltage. The frequency of the AC voltage at which the carrier resonates is proportional to the transport rate of the carrier. Thus, FIG. 9 and FIG. 10 show that as the position of the peak of each spectrum in the horizontal axis direction becomes a higher frequency, the transport rate of the carrier corresponding to the peak of the spectrum becomes faster.

Note that in FIGS. 9 and 10, each impedance spectrum may have two peaks, particularly in an impedance spectrum of a low DC voltage value. In this case, a low frequency peak indicates an impedance peak of electrons, and a high frequency peak indicates an impedance peak of positive holes. Accordingly, an overlapping of two peaks forming a single peak indicates that the transport rate of electrons and the transport rate of positive holes are approximately matching.

As shown in FIG. 9, the impedance spectrum of the light-emitting element according to Example 1 has an impedance peak of positive holes at a higher frequency in terms of the frequency of the AC voltage in comparison to the impedance spectrum of the light-emitting element according to Example 2. This indicates that, in the light-emitting element according to Example 1, the positive holes are transported to the light-emitting layer 14 at a higher speed and at a lower DC voltage value in comparison to the light-emitting element according to Example 2. This is thought to be because the layer thickness d12 of the second hole transport layer 12 of the light-emitting element according to Example 1 is thinner than the layer thickness d12 of the second hole transport layer 12 of the light-emitting element according to Example 2, and thus the transportability of the positive holes is higher. Therefore, in the light-emitting element according to Example 1, a shortage of positive holes in the light-emitting layer 14 is more efficiently eliminated in comparison to the light-emitting element according to Example 2, and the external quantum efficiency and the lifetime are improved.

Similarly, as shown in FIG. 10, the impedance spectrum of the light-emitting element according to Example 3 has an impedance peak of positive holes at a higher frequency in terms of the frequency of the AC voltage in comparison to the impedance spectrum of the light-emitting element according to Example 4. This is considered to occur for the same reason described in the comparison between the light-emitting element according to Example 1 and the light-emitting element according to Example 2. Therefore, in the light-emitting element according to Example 3, a shortage of positive holes in the light-emitting layer 14 is more efficiently eliminated in comparison to the light-emitting element according to Example 4, and the external quantum efficiency and the lifetime are improved.

Second Embodiment

Figure 11:
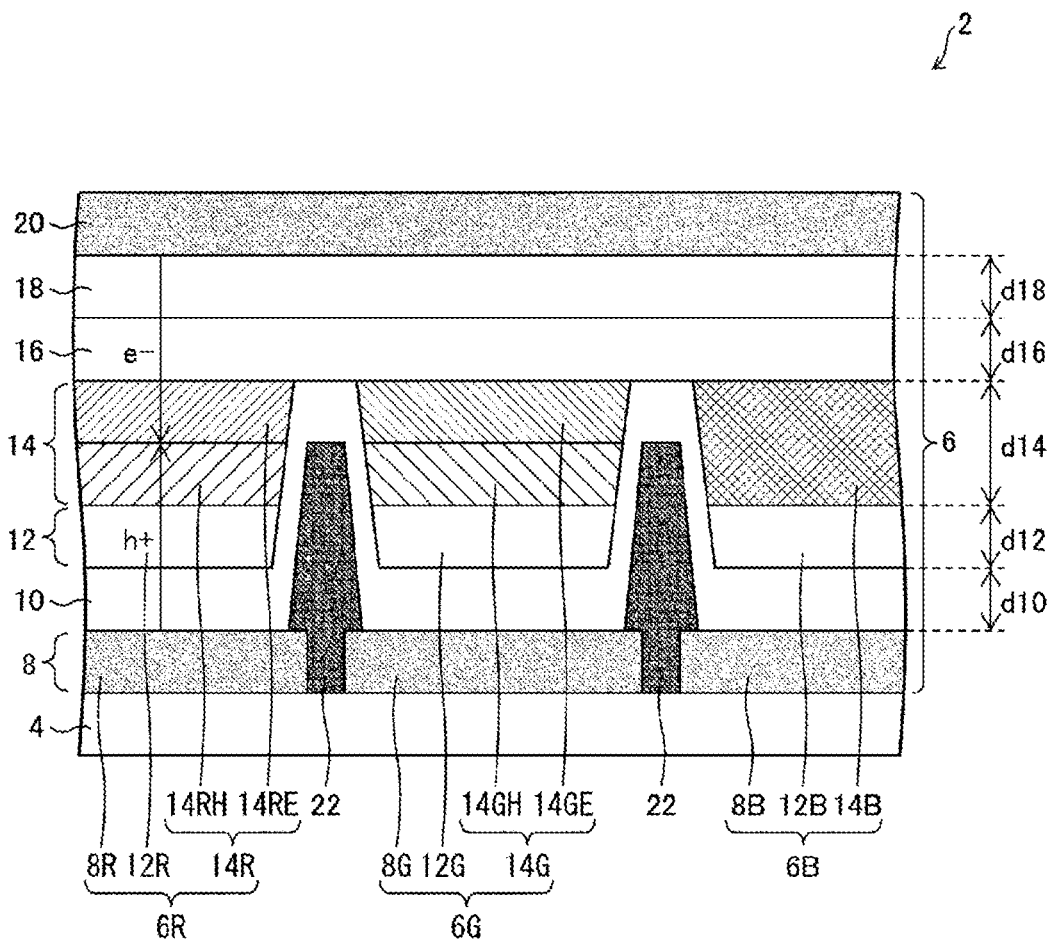
FIG. 11 is a schematic cross-sectional view of a display device according to a second embodiment of the disclosure.

FIG. 11 is a cross-sectional view of a display device 2 according to a second embodiment, at a position corresponding to FIG. 1. As illustrated in FIG. 11, in the display device 2 according to the present embodiment, the light-emitting layer 14R includes, from the anode electrode 8 side, a first light-emitting layer 14RH and a second light-emitting layer 14RE, and thereby the display device 2 according to the present embodiment differs in configuration from the display device 2 according to the previous embodiment. With the exception of this point, the display device 2 according to the present embodiment has the same configuration as that of the display device 2 according to the previous embodiment.

In the present embodiment, the first light-emitting layer 14RH is a hole-transporting type red light-emitting layer, and the second light-emitting layer 14RE is an electron-transporting type red light-emitting layer. The light-emitting element 6R according to the present embodiment may have the same configuration as the light-emitting element 6G with the exception that light from the first light-emitting layer 14RH and the second light-emitting layer RE is red light. For example, the relationship between the value of the LUMO level and the value of the HOMO level of each layer of the light-emitting element 6R and the relationship between the layer thicknesses thereof are the same as the relationship between the value of the LUMO level and the value of the HOMO level of each layer of the light-emitting element 6G and the relationship between the layer thicknesses thereof.

In the present embodiment as well, for the same reason as in the previous embodiment, the luminous efficiency and the lifetime of the light-emitting element 6B, the light-emitting element 6G, and the light-emitting element 6R are more efficiently improved.

A display device 2 having higher luminous efficiency and an improved lifetime can be obtained by providing the display device 2 with the light-emitting element 6R, the light-emitting element 6G, and the light-emitting element 6B according to each embodiment described above.

The disclosure is not limited to each of the embodiments described above, and various modifications may be made within the scope of the claims. Embodiments obtained by appropriately combining technical approaches disclosed in each of the different embodiments also fall within the technical scope of the disclosure.

Furthermore, novel technical features can be formed by combining the technical approaches disclosed in each of the embodiments.

The invention claimed is:

1. A light-emitting element comprising:
an anode electrode;
a cathode electrode; and
a first hole transport layer, a second hole transport layer, a light-emitting layer, a first electron transport layer, and a second electron transport layer, located between the anode electrode and the cathode electrode, in this order from an anode electrode side,
wherein, at a highest occupied molecular orbital (HOMO) level, an energy level difference between the second hole transport layer and the light-emitting layer on a second hole transport layer side is from 0.0 eV to 0.15 eV,
at a lowest unoccupied molecular orbital (LUMO) level, an energy level difference between the first electron transport layer and the light-emitting layer on a first electron transport layer side is from 0.0 eV to 0.15 eV, and
the second electron transport layer is a mixed layer, including an organic material having electron transport properties and an electron-accepting material, and the electron-accepting material in the mixed layer is in an amount greater than 50 mass %, wherein the light-emitting layer includes:
a first light-emitting layer of a hole-transporting type on the second hole transport layer side, and a second light-emitting layer of an electron-transporting type on the first electron transport layer side, wherein a value obtained by dividing a layer thickness of the second hole transport layer by a total of a layer thickness of the first light-emitting layer and a layer thickness of the second light-emitting layer is greater than 0 and equal to or less than 0.75, a value obtained by dividing a layer thickness of the first electron transport layer by the layer thickness of the second hole transport layer is greater than 0 and equal to or less than 0.5, and a value obtained by dividing the layer thickness of the first electron transport layer by a total of the layer thickness of the first electron transport layer and a layer thickness of the second electron transport layer is greater than 0 and less than 0.5.

2. The light-emitting element according to claim 1, wherein a layer thickness of the light-emitting layer is greater than a layer thickness of the second hole transport layer, and is greater than a layer thickness of the first electron transport layer.

3. The light-emitting element according to claim 1, wherein the electron-accepting material is a lithium quinolate complex.

4. The light-emitting element according to claim 1, wherein a value of the HOMO level of the light-emitting layer on the first electron transport layer side is greater than a value of the HOMO level of the first electron transport layer by 0.25 eV or more, and a value of the LUMO level of the second hole transport layer is greater than a value of the LUMO level of the light-emitting layer on the second hole transport layer side by 0.25 eV or more.

5. The light-emitting element according to claim 4, wherein the value of the HOMO level of the light-emitting layer on the first electron transport layer side is greater than the value of the HOMO level of the first electron transport layer by 0.45 eV or more, and the value of the LUMO level of the second hole transport layer is greater than the value of the LUMO level of the light-emitting layer on the second hole transport layer side by 0.45 eV or more.

6. The light-emitting element according to claim 4, wherein the value of the HOMO level of the light-emitting layer on the first electron transport layer side is greater than the value of the HOMO level of the first electron transport layer and/or a value of the HOMO level of the second electron transport layer by 0.45 eV or more, and the value of the LUMO level of the first hole transport layer and/or a value of the LUMO level of the second hole transport layer is greater than the value of the LUMO level of the light-emitting layer on the second hole transport layer side by 0.45 eV or more.

7. The light-emitting element according to claim 1, wherein the light-emitting layer includes two or more types of host materials.

8. The light-emitting element according to claim 7, wherein the light-emitting layer includes only two types of host materials.

9. The light-emitting element according to claim 1, wherein a value of the HOMO level of the first light-emitting layer is greater than a value of the HOMO level of the second light-emitting layer by 0.25 eV or more, and a value of the LUMO level of the first light-emitting layer is greater than a value of the LUMO level of the second light-emitting layer by 0.25 eV or more.

10. The light-emitting element according to claim 1, wherein the light-emitting layer emits green light.

11. The light-emitting element according to claim 1, wherein the light-emitting layer emits red light.

12. A display device, comprising:
at least one of the light-emitting element according to claim 1.

* * * * *